(12) United States Patent
He et al.

(10) Patent No.: US 12,133,449 B2
(45) Date of Patent: Oct. 29, 2024

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yupeng He, Beijing (CN); Yang Zhou, Beijing (CN); Yao Huang, Beijing (CN); Xin Zhang, Beijing (CN); Yu Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 607 days.

(21) Appl. No.: 17/599,654

(22) PCT Filed: Oct. 21, 2020

(86) PCT No.: PCT/CN2020/122455
§ 371 (c)(1),
(2) Date: Sep. 29, 2021

(87) PCT Pub. No.: WO2022/082500
PCT Pub. Date: Apr. 28, 2022

(65) Prior Publication Data
US 2022/0320196 A1    Oct. 6, 2022

(51) Int. Cl.
*H10K 59/88* (2023.01)
*G09G 3/20* (2006.01)
(Continued)

(52) U.S. Cl.
CPC .............. *H10K 59/88* (2023.02); *G09G 3/20* (2013.01); *H10K 59/1216* (2023.02);
(Continued)

(58) Field of Classification Search
CPC .. H10K 59/88; H10K 59/131; H10K 59/1216; G09G 3/20; G09G 2300/0413;
(Continued)

(56) References Cited

U.S. PATENT DOCUMENTS

| 2015/0262526 A1* | 9/2015 | Park ................... G09G 3/3233 345/76 |
| 2021/0043147 A1 | 2/2021 | Hao et al. |
| 2021/0125533 A1 | 4/2021 | Wang et al. |

FOREIGN PATENT DOCUMENTS

| CN | 209691758 U | 11/2019 |
| CN | 110634432 A | 12/2019 |

(Continued)

*Primary Examiner* — Igwe U Anya
(74) *Attorney, Agent, or Firm* — HOUTTEMAN LAW LLC

(57) ABSTRACT

The present disclosure provides a display substrate and a display device, and belongs to the field of display technology. The display substrate provided by the present disclosure has a display area and a peripheral area surrounding the display area, and includes a substrate; a plurality of pixel circuits on the substrate and in the display area; and a plurality of dummy pixel circuits on the substrate and in the peripheral area; wherein the number of transistors in each dummy pixel circuit is smaller than the number of transistors in each pixel circuit. Because the number of the transistors in the dummy pixel circuit is smaller than the number of the transistors in the pixel circuit, space occupied by the dummy pixel circuit in the peripheral area can be reduced, thereby facilitating realization of a display device with a narrow bezel.

14 Claims, 10 Drawing Sheets

(51) Int. Cl.
*H10K 59/121* (2023.01)
*H10K 59/131* (2023.01)

(52) U.S. Cl.
CPC ... *H10K 59/131* (2023.02); *G09G 2300/0413* (2013.01); *G09G 2300/0426* (2013.01); *G09G 2300/0819* (2013.01); *G09G 2300/0842* (2013.01); *G09G 2300/0861* (2013.01)

(58) Field of Classification Search
CPC ... G09G 2300/0426; G09G 2300/0819; G09G 2300/0842; G09G 2300/0861
USPC .......................................................... 257/40
See application file for complete search history.

(56) References Cited

FOREIGN PATENT DOCUMENTS

| | | |
|---|---|---|
| CN | 111180494 A | 5/2020 |
| CN | 111540756 A | 8/2020 |
| JP | 2012173489 A | 9/2012 |
| KR | 20200036290 A | 4/2020 |

\* cited by examiner

601

DISPLAY SUBSTRATE AND DISPLAY DEVICE

CROSS-REFERENCE TO RELATED APPLICATION

This is a National Phase application filed under 35 U.S.C. 371 as a national stage of PCT/CN2020/122455, filed on Oct. 21, 2020, the disclosure of which is incorporated herein by reference.

TECHNICAL FIELD

The present disclosure relates to the field of display, in particular to a display substrate and a display device.

BACKGROUND

Generally, in a process of manufacturing a display substrate, dummy pixel circuits are arranged in a circle around the display area of the display substrate to ensure etching accuracy and uniformity in manufacturing the pixel circuits in the display area. However, the dummy pixel circuits occupy relatively large space, and therefore it is difficult to achieve a panel with a narrow bezel.

SUMMARY

The present disclosure aims to solve at least one of the technical problems in the related art, and to provide a display substrate that can reduce the space occupied by the dummy pixel circuit in the peripheral area. Therefore, if the display substrate is used to form a display panel, it is beneficial to realize a display device with a narrow bezel.

In a first aspect, embodiments of the present disclosure provide a display substrate having a display area and a peripheral area surrounding the display area, and the display substrate including:
  a substrate;
  a plurality of pixel circuits on the substrate and in the display area; and
  a plurality of dummy pixel circuits on the substrate and in the peripheral area; wherein
  a number of transistors in each dummy pixel circuit is smaller than a number of transistors in each pixel circuit.

In the display substrate provided by the embodiments of the present disclosure, because the number of the transistors in the dummy pixel circuit is smaller than the number of the transistors in the pixel circuit, space occupied by the dummy pixel circuit in the peripheral area can be reduced, thereby facilitating realization of a display device with a narrow bezel.

In some exemplary embodiments, the dummy pixel circuit includes a driving transistor, a first light emission control transistor, a second light emission control transistor, a first reset transistor, and a storage capacitor; wherein
  the driving transistor is on a side of the storage capacitor close to the substrate; and
  the first reset transistor is on a side, away from the storage capacitor, of a connection line between the first light emission control transistor and the second light emission control transistor.

In some exemplary embodiments, the display substrate further includes:
  a plurality of scan signal lines extending from the display area to the peripheral area along a first direction and being on the substrate;
  a plurality of reset power signal lines extending from the display area to the peripheral area along the first direction and being on a side of a layer where the plurality of scan signal lines are located away from the substrate;
  a plurality of reset control signal lines extending from the display area to the peripheral area along the first direction and being in the same layer as the plurality of scan signal lines; and
  a plurality of light emission control signal lines extending from the display area to the peripheral area along the first direction and in the same layer as the plurality of scan signal lines; wherein:
  a first electrode of the first reset transistor is electrically connected to the reset power signal line;
  a control electrode of the first reset transistor is electrically connected to the reset control signal line; and
  a control electrode of the first light emission control transistor is electrically connected to the light emission control signal line.

In some exemplary embodiments, the display substrate further includes:
  a plurality of data lines extending from the display area to the peripheral area along a second direction and being on a side of the plurality of reset power signal lines away from the plurality of scan signal lines;
  a plurality of power supply signal lines extending from the display area to the peripheral area along the second direction, the plurality of power supply signal lines and the plurality of data lines being arranged alternately in a same layer; the first direction intersecting the second direction; wherein:
  a first electrode of the storage capacitor is electrically connected to the power supply signal line, and a second electrode of the storage capacitor is electrically connected to a control electrode of the driving transistor; and a first electrode of the first light emission control transistor is electrically connected to the power supply signal line.

In some exemplary embodiments, the display substrate further includes a first electrode; the first electrode is disposed on a side of the plurality of data lines away from the substrate; wherein:
  a second electrode of the first reset transistor is electrically connected to the first electrode; and
  a second electrode of the second light emission control transistor is electrically connected to the first electrode.

In some exemplary embodiments, each of the plurality of dummy pixel circuits further includes a first connection portion, a second connection portion, and a third connection portion in the same layer as the data line; the first connection portion, the second connection portion, and the third connection portion are arranged along the second direction;
  the first connection portion is configured to be connected to the reset power signal line and the first electrode of the first reset transistor, the second connection portion is configured to be connected to the control electrode of the driving transistor, and the third connection portion is configured to be connected to the second electrode of the second light emission control transistor and the first electrode.

In some exemplary embodiments, the display substrate further includes: an active semiconductor layer on the substrate; the active semiconductor layer includes active layers of all transistors in the plurality of pixel circuits and the plurality of dummy pixel circuits.

In some exemplary embodiments, active layers of all transistors in each dummy pixel circuit are formed as a single piece.

In some exemplary embodiments, the display substrate further includes:
a first conductive layer on a side of the active semiconductor layer away from the substrate; and
a gate insulating layer between the active semiconductor layer and the first conductive layer; wherein,
the first conductive layer includes second electrodes of a plurality of storage capacitors, the plurality of scan signal lines extending in the first direction, the plurality of reset control signal lines extending in the first direction, and the plurality of light emission control signal lines extending in the first direction; and
in the peripheral area, in each dummy pixel circuit, the first conductive layer further includes gates of the first light emission control transistor, the second light emission control transistor, and the first reset transistor.

In some exemplary embodiments, the display substrate further includes:
a second conductive layer on a side of the first conductive layer away from the gate insulating layer; and
a first insulating layer between the second conductive layer and the first conductive layer; wherein:
the second conductive layer includes the plurality of reset power signal lines extending along the first direction, and first electrodes of the plurality of storage capacitors.

In some exemplary embodiments, the display substrate further includes:
a source/drain metal layer on a side of the second conductive layer away from the first insulating layer; and
a second insulating layer between the source/drain metal layers and the second conductive layer; wherein:
the source/drain metal layer includes the plurality of power supply signal lines extending in the second direction, the plurality of data lines extending in the second direction, a plurality of first connection portions, a plurality of second connection portions, and a plurality of third connection portions.

In some exemplary embodiments, the display substrate further includes: a gate drive on array on at least one side of the peripheral area away from the display area, and the gate drive on array is connected to the pixel circuit in the display area through a first lead passing through the peripheral area.

In some exemplary embodiments, each pixel circuit includes a first light emission control transistor, a second light emission control transistor, a driving transistor, a data writing transistor, a storage capacitor, a threshold compensation transistor, a first reset transistor, and a second reset transistor;
a first electrode of the data writing transistor is electrically connected to a first electrode of the driving transistor, a second electrode of the data writing transistor is electrically connected to the data line to receive a data signal, and a control electrode of the data writing transistor is electrically connected to the scan signal line to receive a scan signal;
a first electrode of the storage capacitor is electrically connected to the power supply signal line, and a second electrode of the storage capacitor is electrically connected to a control electrode of the driving transistor;
a first electrode of the threshold compensation transistor is electrically connected to a second electrode of the driving transistor, a second electrode of the threshold compensation transistor is electrically connected to the control electrode of the driving transistor, and a control electrode of the threshold compensation transistor is electrically connected to the scan signal line to receive a compensation control signal;
a first electrode of the first reset transistor is electrically connected to the reset power signal line to receive a first reset signal, a second electrode of the first reset transistor is electrically connected to the light-emitting device, and a control electrode of the first reset transistor is electrically connected to the reset control signal line to receive a first reset control signal;
a first electrode of the second reset transistor is electrically connected to the reset power signal line to receive a second reset signal, a second electrode of the second reset transistor is electrically connected to the control electrode of the driving transistor, and a control electrode of the second reset transistor is electrically connected to the reset control signal line to receive a second reset control signal;
a first electrode of the first light emission control transistor is electrically connected to the power supply signal line, a second electrode of the first light emission control transistor is electrically connected to the first electrode of the driving transistor, and a control electrode of the first light emission control transistor is electrically connected to the light emission control signal line to receive a first light emission control signal; and
a first electrode of the second light emission control transistor is electrically connected to the second electrode of the driving transistor, a second electrode of the second light emission control transistor is electrically connected to the light-emitting device, and a control electrode of the second light emission control transistor is electrically connected to the light emission control signal line to receive a second light emission control signal.

In a second aspect, embodiments of the present disclosure further provide a display device, including the display substrate as described above.

DETAILED DESCRIPTION

Figure 1:
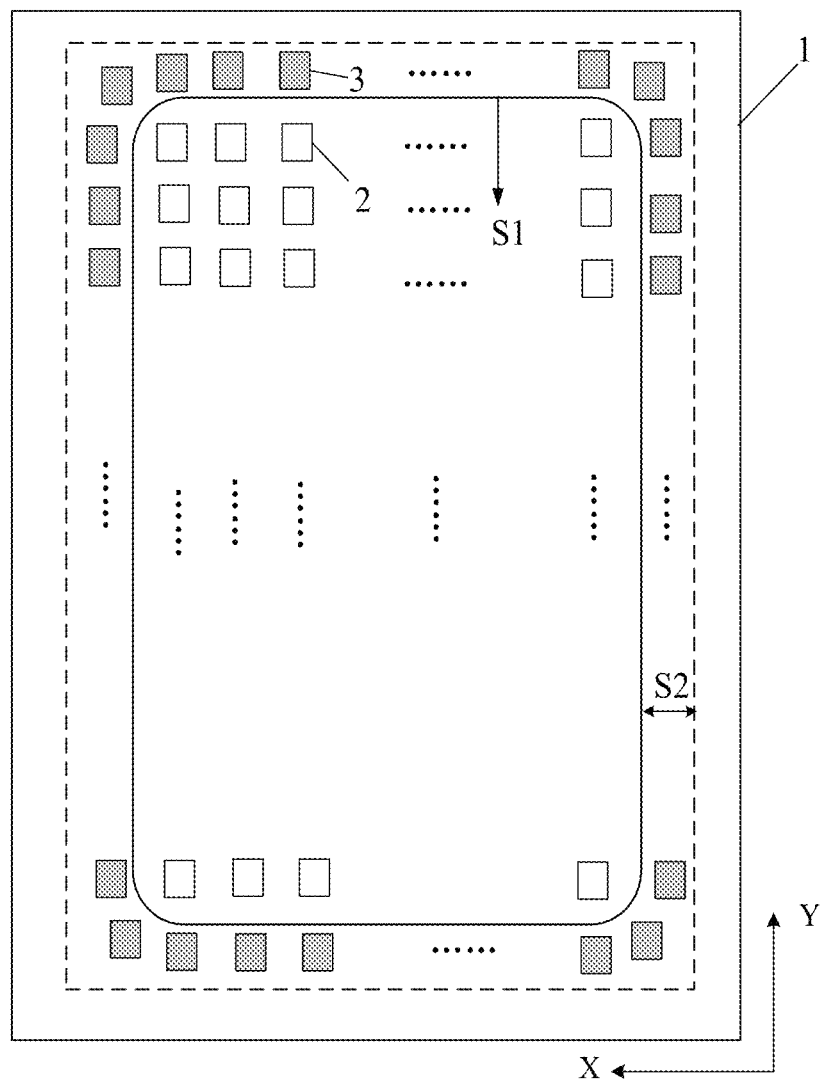
FIG. 1 is a schematic plan view of a structure of a display substrate provided by an embodiment of the present disclosure.

In order to make the objectives, technical solutions and advantages of the present disclosure clearer, the present disclosure will be further described in detail below with reference to the accompanying drawings. Obviously, the described embodiments are only part, but not all, of the embodiments of the present disclosure. Based on the embodiments of the present disclosure, all other embodiments obtained by those of ordinary skill in the art without creative efforts shall fall within the protection scope of the present invention.

The shapes and sizes of the components in the drawings are not drawn to scale, and are only for the purpose of facilitating understanding of the content of the embodiments of the present disclosure.

Unless otherwise defined, the technical terms or scientific terms used in the present disclosure shall have the usual meanings understood by those of ordinary skill in the art to which this disclosure belongs. The words "first", "second" and the like used in the present disclosure do not indicate any order, quantity or importance, but are only used to distinguish different components. Similarly, the word such as "a", "one", "the" or the like do not denote a limitation of quantity, but rather denote the presence of at least one. The word "include", "comprise" or the like means that the element or item appearing in front of the word encompasses the element or item listed after the word and its equivalents, and does not exclude other elements or items. The word such as "connected", "coupled" or the like are not limited to physical or mechanical connections, but may include electrical connections, whether direct or indirect. The words "upper", "lower", "left", "right", and the like are only used to indicate relative positional relationship, which may also change accordingly when an absolute position of an object being described changes.

The transistors used in the embodiments of the present disclosure may be thin film transistors or field effect transistors or other devices with similar characteristics. Since a source and a drain of a used transistor are interchangeable under a certain condition, there is no difference between the source and the drain in terms of the description of connection relationship. In the embodiments of the present disclosure, in order to distinguish a source and a drain of a transistor, one of the source and the drain is called a first electrode, the other is called a second electrode, and a gate is called a control electrode. In addition, transistors may be divided into N-type transistors and P-type transistors according to their characteristics. In the following embodiments, description is given by taking a case where transistors are P-type transistors as an example. When a P-type transistor is used, the first electrode is the source of the P-type transistor, the second electrode is the drain of the P-type transistor, and when a low level is input to the gate, conduction is caused between the source and the drain; and the case is opposite for an N-type transistor. It is conceivable that the implementation using N-type transistors can be easily conceived by those skilled in the art without creative efforts, and therefore it is also within the protection scope of the embodiments of the present disclosure.

It should be noted that the transistors used in the embodiments of the present disclosure may be thin film transistors or field effect transistors or other switching devices with the same characteristics. The thin film transistors may include oxide semiconductor thin film transistors, amorphous silicon thin film transistors, or polysilicon thin film transistors, etc. A source and a drain of a transistor may be symmetrical in structure, and therefore the source and the drain may be indistinguishable in physical structure. In the embodiments of the present disclosure, in order to distinguish the electrodes of the transistor, except for the gate described as a control electrode, one of the source and the drain is directly described as a first electrode and the other is described as a second electrode. Therefore, for all or part of the transistors in the embodiments of the present disclosure, the first electrode and the second electrode are interchangeable as needed.

It should be noted that a first direction and a second direction in the following may be arbitrary directions, and the first direction and the second direction intersect. For example, the first direction may be an extension direction (for example, a row direction) of a first side of the display substrate, and the second direction may be an extension direction (for example, a column direction) of a second side adjacent to the first side of the display substrate. For ease of description, hereinafter, a case where the first direction is the row direction (X direction) parallel to a lower side of the display substrate, the second direction is the column direction (Y direction) parallel to a right side of the display substrate, and the first direction and the second direction are perpendicular or approximately perpendicular to each other is taken as an example for description.

The embodiments of the present disclosure are not limited to the embodiments shown in the drawings, but include modifications of configurations formed based on manufacturing processes. Therefore, the regions illustrated in the drawings are for illustrative purpose, and the shapes of the regions shown in the drawings exemplify the specific shapes of the regions of the elements, but are not intended to be limiting.

In a first aspect, as shown in FIG. 1, an embodiment of the present disclosure provides a display substrate having a display area S1 and a peripheral area S2 surrounding the display area S1. The display panel includes a substrate 1. The display area S1 of the substrate 1 includes a plurality of pixel units. The pixel unit includes a plurality of sub-pixels. Each sub-pixel includes a light-emitting device and a pixel circuit. The pixel circuit is disposed on a side of the light-emitting device close to the substrate. That is, a plurality of pixel circuits 2 are disposed on the substrate 1 and in the display area S1. In a process of manufacturing the pixel circuits 2, since there is a relatively large difference in film structure between the display area S1 and other area outside the display area S1 of the substrate 1, a pattern of a pixel circuit 2 near a boundary of the display area S1 and the other area will be affected, which in turn affects accuracy and uniformity of the pixel circuits. For example, in a case where the patterns of the pixel circuits 2 are etched by a photolithography process, reflection and diffraction paths of light are generated at a pixel circuit 2 in the display area S1, which are different from reflection and diffraction paths of light generated at the other area outside the display area S1. Therefore, an etching error (such as insufficient etching or over-etching) is caused to the pattern of the pixel circuit 2 near the boundary of the display area S1 and the other area due to the difference in reflection and diffraction paths of light, so that there is a relatively large difference between the formed pixel circuit 2 and a pixel circuit 2 far away from the boundary, which further affects uniformity of the plurality of pixel circuits 2 in the display area S1. Therefore, in order to solve this problem, usually, a plurality of dummy pixel circuits 3 are disposed around the display area S1 (i.e., in a peripheral area S2) for transition, so as to reduce the difference between the display area S1 and the area outside the display area S1 on the substrate 1. That is, the display substrate further includes a plurality of dummy pixel circuits 3. The dummy pixel circuits 3 are disposed on the substrate 1 and in the peripheral area S2, and the arrangement of the dummy pixel circuits 3 is the same as that of the pixel circuits 2. The dummy pixel circuit 3 is not provided with a light-emitting device, and is only used as a transitional circuit structure, so that the film structure in the peripheral area of the display area S1 is roughly the same as the film structure in the display area S1 to ensure the etching accuracy and uniformity of the pixel circuits 2 in the display area S1. The pixel circuit 2 includes a plurality of transistors and a storage capacitor, the dummy pixel circuit 3 includes a plurality of transistors and a storage capacitor, and the number of the transistors in the dummy pixel circuit 3 is smaller than the number of the transistors in the pixel circuit 2. Because the number of the transistors in the dummy pixel circuit 3 is smaller than the number of the transistors in the pixel circuit 2, space occupied by the dummy pixel circuit 3 can be reduced, so that the area of the peripheral area S2 can be reduced, which is conducive to achieving a display device with a narrow bezel.

It should be noted that the peripheral area S2 is an area defined by the arrangement positions of the dummy pixel circuits 3, that is, the peripheral area S2 is an area where the plurality of dummy pixel circuits 3 are disposed on the substrate 1.

Figure 2A:
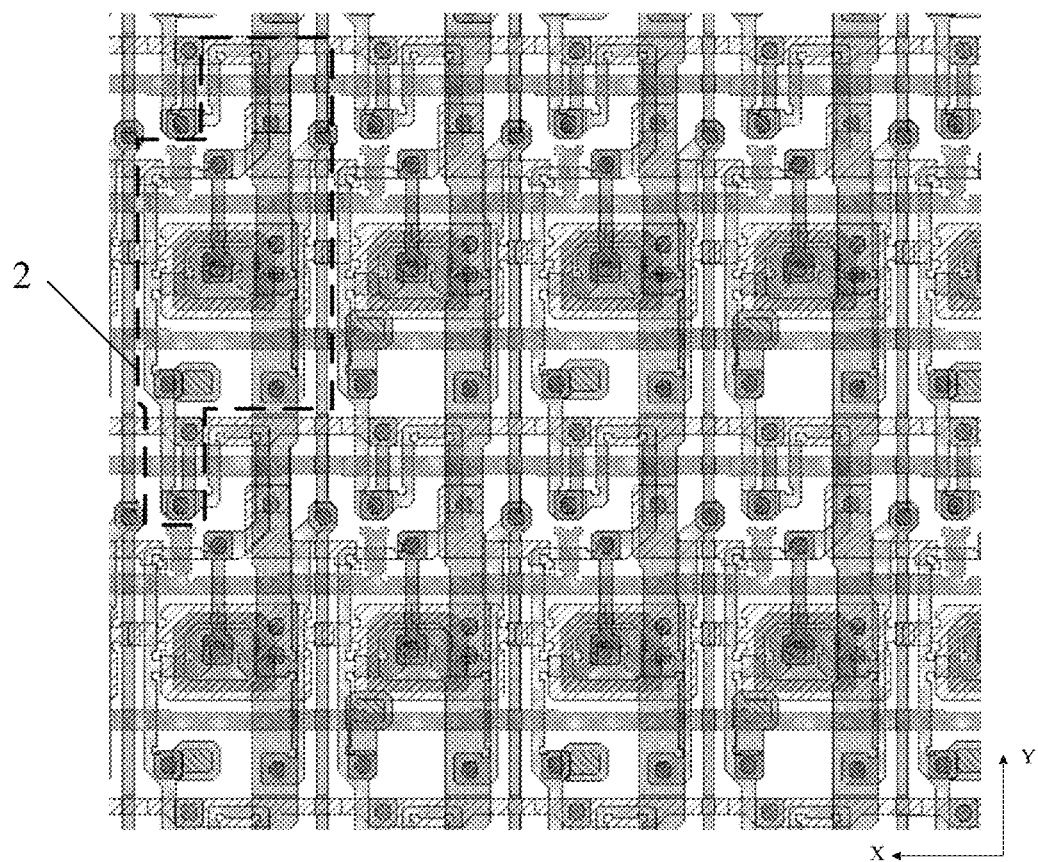
FIG. 2A is a circuit layout illustrating arrangement of pixel circuits in a display area of a display substrate provided by an embodiment of the present disclosure.

As shown in FIG. 2A, FIG. 2A is a circuit layout illustrating arrangement of pixel circuits 2 on the substrate 1 in the display area S1. A plurality of pixel circuits 2 are repeatedly arranged on the substrate 1 and in the display area S1 along the first direction (i.e., X direction) and the second direction (i.e., Y direction), and each pixel circuit is configured to drive a light-emitting device of a sub-pixel in the pixel unit through one of a plurality of signal lines (detailed later).

The pixel circuit 2 in the display area S1 may adopt various structures. For example, the pixel circuit 2 may adopt a structure of 3T1C having three transistors and one capacitor, or a structure of 7T1C having seven transistors and one capacitor, or a structure of 12T1C having twelve transistors and one capacitor, etc. A case where the pixel circuit 2 includes 7T1C is taken as an example, and specifically, the pixel circuit 2 includes a driving transistor T3, a data writing transistor T4, a storage capacitor Cst, a threshold compensation transistor T2, a first reset transistor T7, a second reset transistor T1, a first light emission control transistor T5, and a second light emission control transistor T6.

Figure 2B:
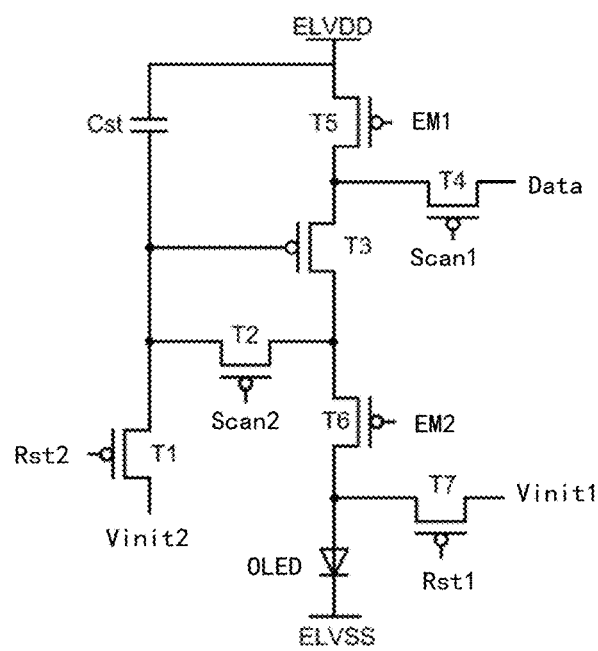
FIG. 2B is an equivalent circuit diagram of a pixel circuit in a display area of a display substrate provided by an embodiment of the present disclosure.
Figure 2C:
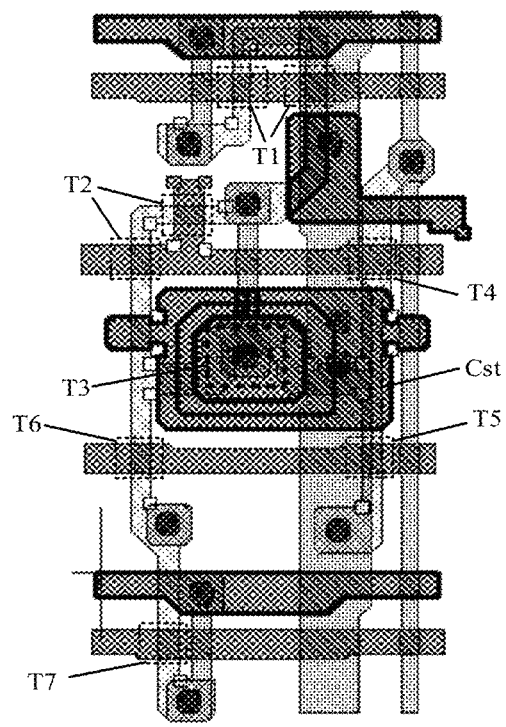
FIG. 2C is a circuit layout of a single pixel circuit in a display area of a display substrate provided by an embodiment of the present disclosure.

As shown in FIGS. 2B and 2C, FIG. 2B is a schematic circuit diagram of a pixel circuit 2 (the pixel circuit 2 including 7T1C) in a sub-pixel of a pixel unit in a display substrate provided by an embodiment of the present disclosure, and FIG. 2C is a circuit layout of a single pixel circuit 2 in FIG. 2A. As shown in FIG. 2B, the pixel circuit 2 includes a driving transistor T3, a data writing transistor T4, a storage capacitor Cst, a threshold compensation transistor T2, a first reset transistor T7, a second reset transistor T1, a first light emission control transistor T5, and a second light emission control transistor T6. Each sub-pixel of the pixel unit further includes a light-emitting device (not shown in the figure), and the light-emitting device includes a first electrode, a light emission layer, and a second electrode that are sequentially disposed on the substrate 1.

For example, as shown in FIG. 2B, a first electrode of the data writing transistor T4 is electrically connected to a first electrode of the driving transistor T3, and a second electrode of the data writing transistor T4 is configured to be electrically connected to a data line Data to receive a data signal, and a control electrode of the data writing transistor T4 is configured to be electrically connected to a first scan signal line Scan1 to receive a scan signal; a first electrode of the storage capacitor Cst is electrically connected to a first power supply terminal ELVDD, and a second electrode of the storage capacitor Cst is electrically connected to a control electrode of the driving transistor T3; a first electrode of the threshold compensation transistor T2 is electrically connected to a second electrode of the driving transistor T3, a second electrode of the threshold compensation transistor T2 is electrically connected to the control electrode of the driving transistor T3, and a control electrode of the threshold compensation transistor T2 is configured to be electrically connected to a second scan signal line Scan2 to receive a compensation control signal; a first electrode of the second reset transistor T1 is configured to be electrically connected to a second reset power terminal Vinit2 to receive a second reset signal, a second electrode of the second reset transistor T1 is electrically connected to the control electrode of the driving transistor T3, and a control electrode of the second reset transistor T1 is configured to be electrically connected to a second reset control signal line Rst2 to receive a second reset control signal; a first electrode of the first reset transistor T7 is configured to be electrically connected to a first reset power terminal Vinit1 to receive a first reset signal, a second electrode of the first reset transistor T7 is electrically connected to a first electrode of the light-emitting device OLED, and a control electrode of the first reset transistor T7 is configured to be electrically connected to a first reset control signal line Rst1 to receive a first reset control signal; a first electrode of the first light emission control transistor T5 is electrically connected to a first power supply terminal ELVDD, and a second electrode of the first light emission control transistor T5 is electrically connected to the first electrode of the driving transistor T3, and a control electrode of the first light emission control transistor T5 is configured to be electrically connected to a first light emission control signal line EM1 to receive a first light emission control signal; a first electrode of the second light emission control transistor T6 is electrically connected to the second electrode of the driving transistor T3, a second electrode of the second light emission control transistor T6 is electrically connected to a first electrode of the light-emitting device OLED, and a control electrode of the second light emission control transistor T6 is configured to be electrically connected to a second light emission control signal line EM2 to receive a second light emission control signal; a second electrode of the light-emitting device OLED is electrically connected to a second power supply terminal ELVSS.

For example, one of the first power supply terminal ELVDD and the second power supply terminal ELVSS is a high-voltage terminal, and the other is a low-voltage terminal. For example, in the embodiment shown in FIG. 2B, the first power supply terminal ELVDD is a voltage source for outputting a constant first voltage, the first voltage being a positive voltage; and the second power supply terminal ELVSS may be a voltage source for outputting a constant second voltage, the second voltage being a negative voltage. For example, in some embodiments, the second power supply terminal ELVSS may be grounded.

For example, as shown in FIG. 2B, the scan signal and the compensation control signal may be the same, that is, the control electrode of the data writing transistor T4 and the control electrode of the threshold compensation transistor T2 may be electrically connected to the same signal line, for example, both are electrically connected to the first scan signal line Scan1 to receive the same signal (e.g., scan signal). In this case, the display substrate may not be provided with the second scan signal line Scan2, so as to reduce the number of signal lines. For another example, the control electrode of the data writing transistor T4 and the control electrode of the threshold compensation transistor T2 may be electrically connected to different signal lines, that is, the control electrode of the data writing transistor T4 is electrically connected to the first scan signal line Scan1, the control electrode of the threshold compensation transistor T2 is electrically connected to the second scan signal line Scan2, and the first scan signal line Scan1 and the second scan signal line Scan2 transmit the same signal.

It should be noted that the scan signal and the compensation control signal may also be different, so that the control electrodes of the data writing transistor T4 and the threshold compensation transistor T2 can be controlled independently, which increases control flexibility of the pixel circuit.

For example, as shown in FIG. 2B, the first light emission control signal and the second light emission control signal may be the same, that is, the control electrode of the first light emission control transistor T5 and the control electrode of the second light emission control transistor T6 may be electrically connected to the same signal line, such as the first light emission control signal line EM1, to receive the same signal (e.g., the first light emission control signal). In this case, the display substrate may not be provided with the second light emission control signal line EM2, so as to reduce the number of signal lines. For another example, the control electrode of the first light emission control transistor T5 and the control electrode of the second light emission control transistor T6 may be electrically connected to different signal lines, that is, the control electrode of the first light emission control transistor T5 is electrically connected to the first light emission control signal line EM1, the control electrode of the second light emission control transistor T5 is electrically connected to the second light emission control signal line EM2, and the first light emission control signal line EM1 and the second light emission control signal line EM2 transmit the same signal.

It should be noted that when the first light emission control transistor T5 and the second light emission control transistor T6 are transistors of different types, for example, the first light emission control transistor T5 is a P-type transistor, and the second light emission control transistor T6 is an N-type transistor, the first light emission control signal and the second light emission control signal may be different, which is not limited in the embodiments of the present disclosure.

For example, the first reset control signal and the second reset control signal may be the same, that is, the control electrode of the second reset transistor T1 and the control electrode of the first reset transistor T7 may be electrically connected to the same signal line, for example, the first reset control signal line Rst1 to receive the same signal (e.g., a first sub-reset control signal). In this case, the display substrate may not be provided with the second reset control signal line Rst2, so as to reduce the number of signal lines. For another example, the control electrode of the second reset transistor T1 and the control electrode of the first reset transistor T7 may be electrically connected to different signal lines, that is, the control electrode of the second reset transistor T1 is electrically connected to the second reset control signal line Rst2, the control electrode of the first reset transistor T7 is electrically connected to the first reset control signal line Rst1, and the first reset control signal line Rst1 and the second reset control signal line Rst2 transmit the same signal. It should be noted that the first reset control signal and the second reset control signal may also be different.

For example, in some embodiments, the second reset control signal may be the same as the scan signal, that is, the control electrode of the first reset transistor T7 may be electrically connected to the scan signal line Scan to receive the scan signal as the second reset control signal.

For example, the second electrode of the second reset transistor T1 and the second electrode of the first reset transistor T7 are connected to the second reset power terminal Vinit2 and the first reset power terminal Vinit1, respectively, the first reset power terminal Vinit1 and the second reset power terminal Vinit2 may be DC reference voltage terminals for outputting a constant DC reference voltage. The first reset power terminal Vinit1 and the second reset power terminal Vinit2 may be the same. For example, the source of the second reset transistor T1 and the source of the first reset transistor T7 are connected to the same reset power terminal. The first reset power terminal Vinit1 and the second reset power terminal Vinit2 may be high-voltage terminals or low-voltage terminals, as long as they can provide the first reset signal and the second reset signal to reset the control electrode of the driving transistor T3 and the first electrode of the light-emitting device OLED, which is not limited in the embodiments of the present disclosure. For example, the second electrode of the second reset transistor T1 and the second electrode of the first reset transistor T7 may both be connected to a reset power signal line Init, and connected to the reset power terminal Vinit through the reset power signal line Init.

Figure 3A:
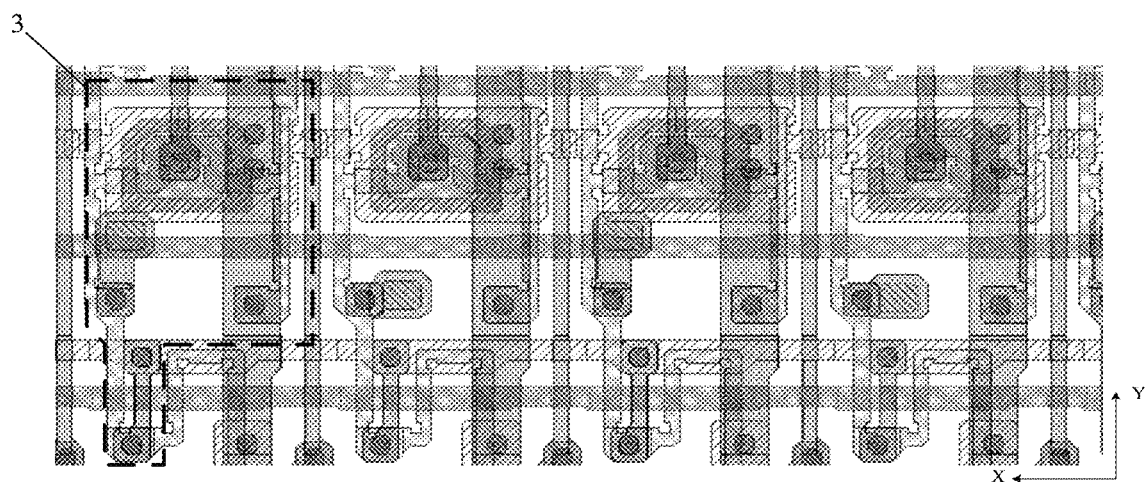
FIG. 3A is a circuit layout illustrating arrangement of dummy pixel circuits in a peripheral area of a display substrate provided by an embodiment of the present disclosure.
Figure 3B:
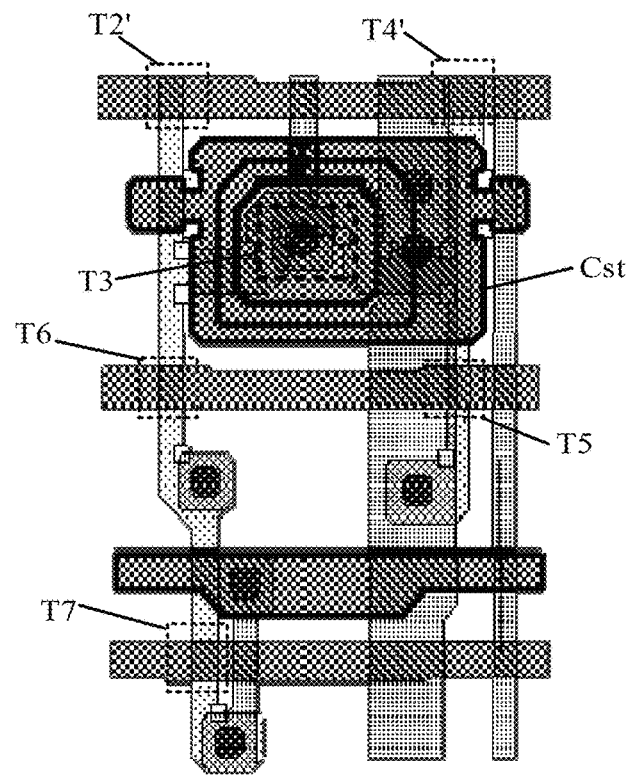
FIG. 3B is a circuit layout of a single dummy pixel circuit in a peripheral area of a display substrate provided by an embodiment of the present disclosure.
Figure 3C:
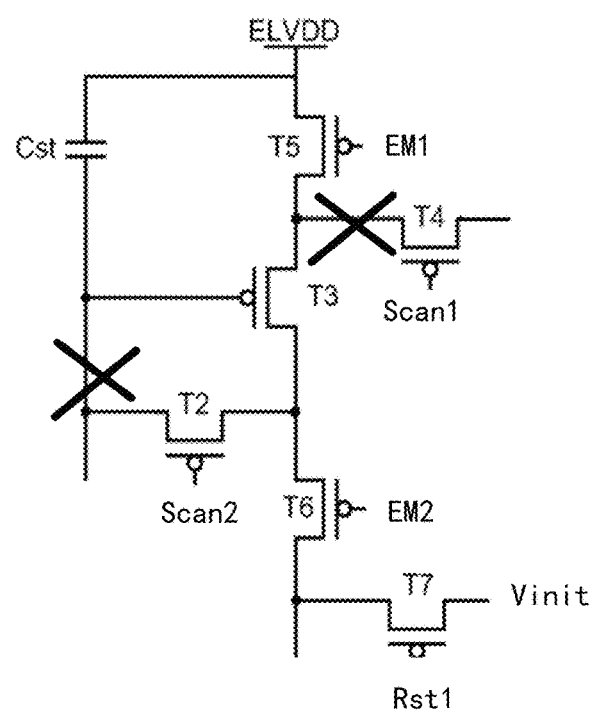
FIG. 3C is a circuit diagram of a dummy pixel circuit in a peripheral area of a display substrate provided by an embodiment of the present disclosure.

As shown in FIG. 1 and FIGS. 3A to 3C, FIG. 3A is a circuit layout of arrangement of dummy pixel circuits 3 on the substrate 1, FIG. 3B is a circuit layout of a single dummy pixel circuit 3 in FIG. 3A in an embodiment, and FIG. 3C is a schematic diagram of an equivalent circuit of a single dummy pixel circuit 3. The dummy pixel circuits 3 are arranged in the peripheral area S2 around the display area S1, and FIG. 3B shows a dummy pixel circuit 3 arranged at the upper rounded corner as an example. The dummy pixel circuit 3 in FIG. 3B is formed by cutting the upper part of the pixel circuit 2 off, and the number of transistors in the dummy pixel circuit 3 is less than the number of transistors in the pixel circuit 2. For example, the dummy pixel circuit 3 may include a driving transistor T3, a first light emission control transistor T5, a second light emission control transistor T6, a first reset transistor T7 and a storage capacitor Cst. The driving transistor T3 is disposed on a side of the storage capacitor Cst close to the substrate 1, the first light emission control transistor T5 and the second light emission control transistor T6 are disposed on a first side of the storage capacitor Cst, for example, the first side in FIG. 3B is the lower side, and the first reset transistor T7 is disposed on a side of a connection line between the first light emission control transistor T5 and the second light emission control transistor T6 away from the storage capacitor Cst. In the embodiment of the dummy pixel circuit 3 shown in FIG. 3B, parts (shown as T2' and T4' in the figure) of the gate of the threshold compensation transistor T2 and the gate of the data writing transistor T4 are disposed at the upper side of the dummy pixel circuit 3, so T2 and T4 are not turned on; it is also possible that T2 and T4 are completely cut off, which is designed according to the specific position where the dummy pixel circuit 3 needs to be disposed. Referring to FIGS. 2C and 3B, the dummy pixel circuit 3 includes a part of the circuit structure of the pixel circuit 2, so the dummy pixel circuit 3 occupies a smaller space than the pixel circuit 2, thereby reducing the area of the peripheral area S2 and further facilitating realization of a display device with a narrow bezel. Because the dummy pixel circuit 3 has the circuit structure of the pixel circuit 2, the dummy pixel circuit 3 can reduce the difference between the display area S1 (the area where the pixel circuit 2 is located) and the area outside the display area S1, thereby ensuring uniformity of the pixel circuits 3. As shown in FIG. 3C, since the dummy pixel circuit 3 only retains the driving transistor T3, the first light emission control transistor T5, the second light emission control transistor T6, the first reset transistor T7 and the storage capacitor Cst in the pixel circuit 2, the first light emission control transistor T5 and the second light emission control transistor T6 are disconnected from and the data writing transistor T4, and the second electrode of the storage capacitor Cst and the control electrode of the driving transistor T3 are disconnected from the threshold compensation transistor T2. The first electrode of the storage capacitor Cst is electrically connected to the first power supply terminal ELVDD, the second electrode of the storage capacitor Cst is electrically connected to the control electrode of the driving transistor T3; the first electrode of the first reset transistor T7 is configured to be electrically connected to the first reset power terminal Vinit1 to receive the first reset signal, the control electrode of the first reset transistor T7 is configured to be electrically connected to the first reset control signal line Rst1 to receive the first reset control signal; the first electrode of the first light emission control transistor T5 is electrically connected to the first power supply terminal ELVDD, the second electrode of the first light emission control transistor T5 is electrically connected to the first electrode of the driving transistor T3, and the control electrode of the first light emission control transistor T5 is configured to be electrically connected to the first light emission control signal line EM1 to receive the first light emission control signal; the first electrode of the second light emission control transistor T6 is electrically connected to the second electrode of the driving transistor T3, and the control electrode of the second light emission control transistor T6 is configured to be electrically connected to the second light emission control signal line EM2 to receive the second light emission control signal.

It should be noted that the structure of the dummy pixel circuit 3 may be changed according to the required position, that is, structure(s) omitted in the dummy pixel circuit 3 may be changed as required. For example, if the dummy pixel circuit 3 is disposed at a position in the peripheral area S2 near the lower side of the display area S1, a lower part of the pixel circuit 3 may be cut off (for example, structures of the first light emission control transistor T5, the second light emission control transistor T6 and the first reset transistor T7 are cut off), which is not limited herein.

Figure 4A:
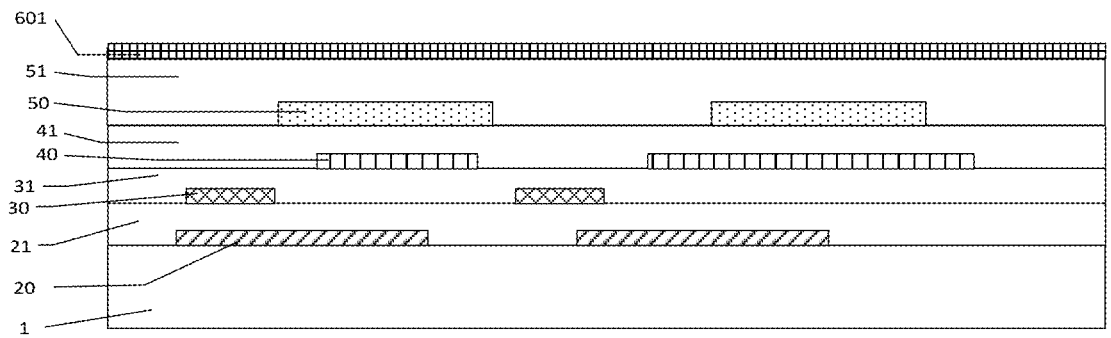
FIG. 4A is schematic diagram of a layer structure of a dummy pixel circuit in a display substrate provided by an embodiment of the present disclosure.

As shown in FIG. 4A, FIG. 4A is a schematic diagram of a layer structure of a dummy pixel circuit 3 in the peripheral area S2 of the display substrate provided by an embodiment of the present disclosure. The display substrate provided by the embodiment of the present disclosure further includes: an active semiconductor layer 20 disposed on the substrate 1, a first conductive layer 30 disposed on a side of the active semiconductor layer 20 away from the substrate 1, a gate insulating layer 21 disposed between the active semiconductor layer 20 and the first conductive layer 30, a second conductive layer 40 disposed on a side of the first conductive layer 30 away from the gate insulating layer 21, a first insulating layer 31 disposed between the second conductive layer 40 and the first conductive layer 30, a source/drain metal layer 50 disposed on a side of the second conductive layer 40 away from the first insulating layer 31, and a second insulating layer 41 between the source/drain metal layer 50 and the second conductive layer 40. The display substrate may further include a planarization layer 51 disposed on a side of the source/drain metal layer 50 away from the substrate 1, and a first electrode 601 disposed on a side of the planarization layer 51 away from the substrate. The first electrode 601 is an electrode of the light-emitting device in the sub-pixel of the pixel unit in the display area S1.

Figure 5:
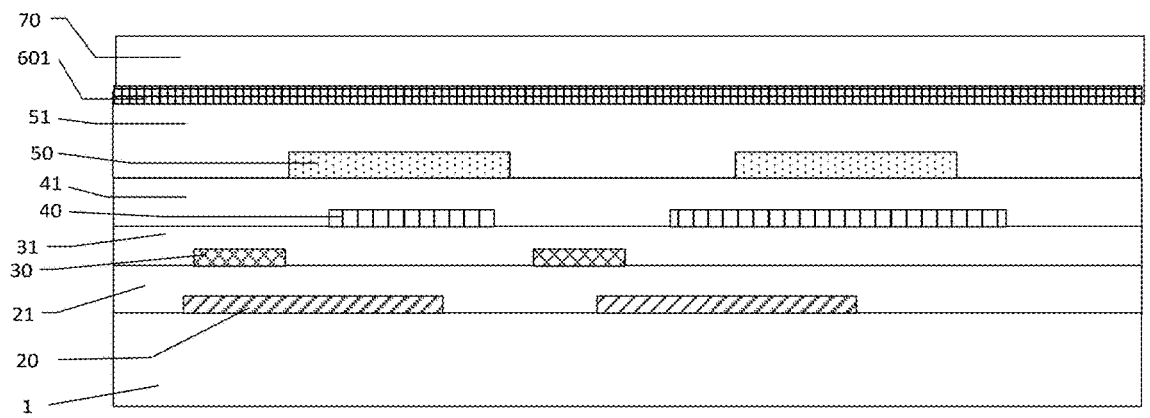
FIG. 5 is a schematic diagram of a layer structure of another dummy pixel circuit in a display substrate provided by an embodiment of the present disclosure.
Figure 6:
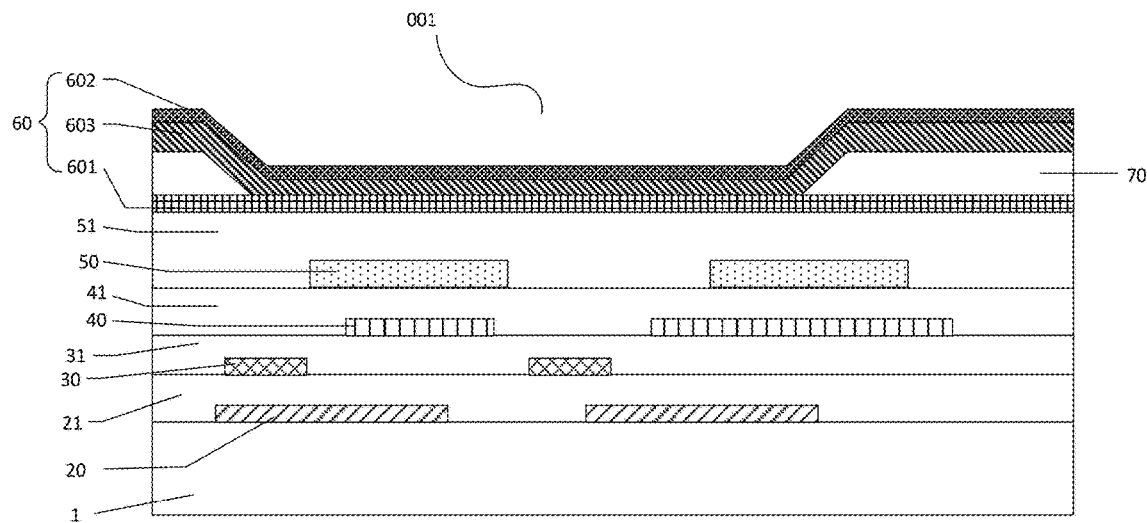
FIG. 6 is a schematic diagram of a layer structure of a pixel circuit in a display substrate provided by an embodiment of the present disclosure.

As shown in FIG. 6, FIG. 6 is a schematic diagram of a layer structure of a pixel circuit 2 in the display area S1 of the display substrate provided by an embodiment of the present disclosure. Between the first electrode 601 and the substrate 1, the layer structure of the pixel circuit 2 is roughly the same as the layer structure of the dummy pixel circuit, except that in the plan structural diagram of each film layer, the dummy pixel circuit 3 only has a part of the structure of the pixel circuit 2 (only has structures of the driving transistor T3, the first light emission control transistor T5, the second light emission control transistor T6 and the first reset transistor T7). A light-emitting device 60 is disposed on a side of the pixel circuit 2 away from the substrate. The light-emitting device 60 includes a first electrode 601, a light emission layer 603 and a second electrode 602 which are sequentially arranged on the side of the planarization layer 51 away from the substrate 1. A pixel defining layer 70 is disposed between adjacent light-emitting devices 60 to define different sub-pixels. The pixel defining layer 70 has an opening 001, and the opening 001 defines a light-emitting area of the light-emitting device 60. Since in the dummy pixel circuit 3, there is no need to drive a light-emitting device to emit light, no light-emitting device is provided in the dummy pixel circuit 3, and no opening is formed. In some embodiments, as shown in FIG. 4A, the first electrode 601 of the light-emitting device 6 may be retained on the side of the planarization layer 51 of the dummy pixel circuit 3 away from the substrate 1. In some other embodiments, as shown in FIG. 5, it is also possible to dispose the first electrode 601 of the light-emitting device 6 on the side of the planarization layer 51 of the dummy pixel circuit 3 away from the substrate 1, and then dispose the pixel defining layer 70 on a side of the first electrode 601 away from the substrate 1, but no opening is formed in the pixel defining layer 70. For ease of description, the following description will be given by taking a case where only the first electrode 601 is disposed on the side of the planarization layer 51 of the dummy pixel circuit 3 away from the substrate 1 as an example.

Figure 4B:
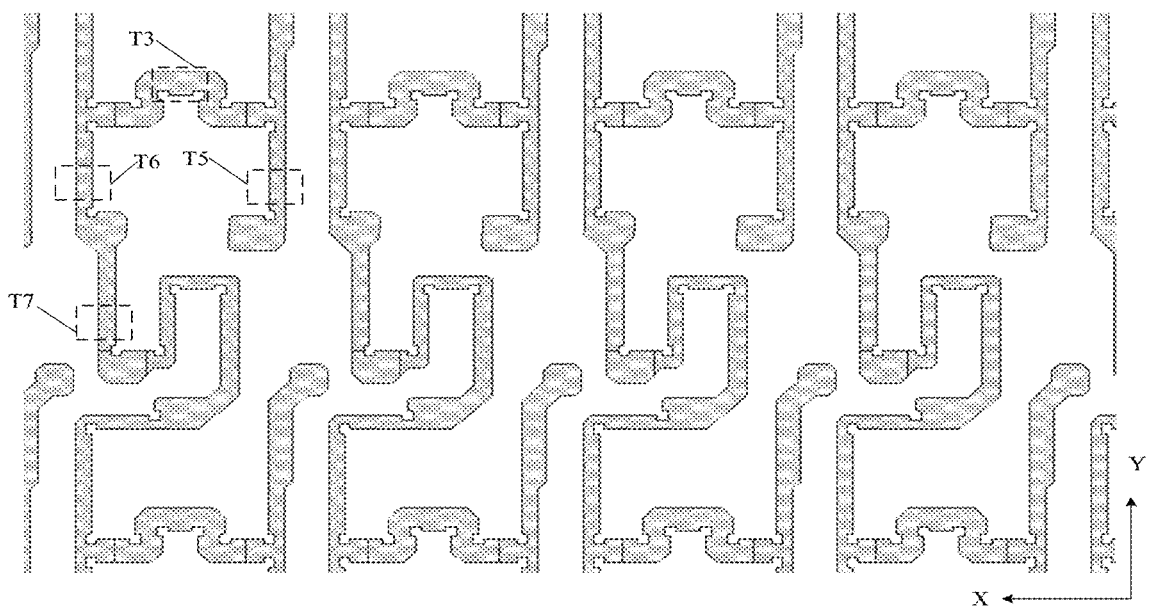
FIG. 4B is a plan structural view of an active semiconductor layer of a dummy pixel circuit in a display substrate provided by an embodiment of the present disclosure.

For example, as shown in FIG. 4B, FIG. 4B shows a schematic plan structural view of the active semiconductor layers 20 of the dummy pixel circuits 3 in the display substrate. The active semiconductor layer 20 may be formed by patterning a semiconductor material. The active semiconductor layer 20 may be used to fabricate the active layers of the first light emission control transistor T5, the second light emission control transistor T6, and the first reset transistor T7 of the above pixel circuit 20. The active semiconductor layer 310 includes patterns of an active layer (a channel region) and a doped region (source/drain doped region) of every transistor in every dummy pixel circuit 3.

In some embodiments, in the active semiconductor layer 310, the active layers of the transistors (e.g., the driving transistor T3, the first light emission control transistor T5, the second light emission control transistor T6, and the first reset transistor T7) in the same dummy pixel circuit 3 are formed to be a single piece, that is, the active layers of the driving transistor T3, the first light emission control transistor T5, the second light emission control transistor T6, and the first reset transistor T7 in the same dummy pixel circuit 3 are connected.

It should be noted that the active layers of the above transistors may include low-temperature polysilicon layers that are formed as a single piece, and the source region and the drain region may become conductive through doping or the like to achieve electrical connection between respective structures. That is, the active semiconductor layers of the transistors of each sub-pixel is a single-piece pattern formed by p-silicon, and the transistors in the same pixel circuit include doped region patterns (i.e., a source region and a drain region) and an active layer pattern, and active layers of different transistors are separated by a doped structure.

For example, the active semiconductor layer 20 may be made of amorphous silicon, polysilicon, an oxide semiconductor material, or the like. It should be noted that the source region and drain region may be regions doped with n-type impurities or p-type impurities.

For example, as shown in FIG. 4B, the active layers in the dummy pixel circuits 3 arranged along the first direction (X direction) in the pixel unit are not connected and are disconnected from each other. The active layers in the dummy pixel circuits 3 arranged in the second direction (Y direction) may be formed as a single piece, or may be disconnected from each other.

FIGS. 4C to 4F also show that the display substrate further includes a scan signal line Scan (including the first scan signal line Scan1 and the second scan signal line Scan2), a reset control signal line Rst (including the first reset control signal line Rst1 and the second reset control signal line Rst2), a reset power signal line Init of a reset power terminal Vinit (including the first reset power signal line Init1 of the first reset power terminal Vinit1 and the second reset power signal line Init2 of the second reset power terminal Vinit2), a light emission control signal line EM (including the first light emission control signal line EM1 and the second light emission control signal line EM2), a data line Data, a power supply signal line VDD, and a sub power supply signal line VDD'.

Specifically, as shown in FIGS. 3C and 4C to 4E, a plurality of scan signal lines Scan, a plurality of reset power signal lines Init, a plurality of reset control signal lines Rst, and a plurality of light emission control signal lines EM extend from the display area S1 to the peripheral area S2 along the first direction (X direction), that is, the foregoing signal lines are arranged in both the display area S1 and the peripheral area S2. In the display area S1, each of the foregoing signal lines is connected to a transistor and/or storage capacitor corresponding to the pixel circuit 2; in the peripheral area S2, each of the foregoing signal lines is connected to a transistor and/or storage capacitor corresponding to a dummy pixel circuit 3. In the dummy pixel circuit 3, similar to the pixel circuit 2, the first electrode of the first reset transistor T7 is electrically connected to the reset power terminal Vinit via the reset power signal line Init, and the control electrode of the first reset transistor T7 is electrically connected to the reset control signal line Rst, and the control electrode of the first light emission control transistor T5 is electrically connected to the light emission control signal line EM.

Furthermore, as shown in FIGS. 3C and 4C to 4E, a plurality of data lines Data and a plurality of power supply signal lines VDD extend from the display area S1 to the peripheral area S2 along the second direction. That is, the foregoing signal lines are arranged in both the display area S1 and the peripheral area S2. In the display area S1, each of the foregoing signal lines is connected to a transistor and/or storage capacitor corresponding to the pixel circuit 2; in the peripheral area S2, each of the foregoing signal lines is connected to a transistor and/or storage capacitor corresponding to a dummy pixel circuit 3. The sub power supply signal line VDD' is connected to the power supply signal line VDD. The transistors in the dummy pixel circuit 3 and in the pixel circuit 2 are connected to the reset power terminal Vinit through the reset power signal line Init. As shown in FIG. 3C, in the dummy pixel circuit 3, similar to the pixel circuit 2, the first electrode of the storage capacitor Cst is electrically connected to the first power supply terminal ELVDD via the power supply signal line VDD, and the second electrode of the storage capacitor Cst is connected to the control electrode of the driving transistor T3, and the first electrode of the first light emission control transistor T5 is electrically connected to the first power supply terminal ELVDD via the power supply signal line VDD.

In some embodiments, as shown in FIGS. 4A and 4C to 4E, the dummy pixel circuit 3 further includes a first electrode 601 disposed on the side of the planarization layer 51 away from the substrate 1. In the dummy pixel circuit 3, similar to the pixel circuit 2, the second electrode of the first reset transistor T5 is electrically connected to the first electrode 601, and the second electrode of the second light emission control transistor T6 is electrically connected to the first electrode 601.

It should be noted that in the exemplary embodiments shown in FIGS. 4B to 4F, the first scan signal line Scan1 and the second scan signal line Scan2 are the same scan signal line Scan, the first reset power signal line Init1 and the second reset power signal line Init2 are the same reset power signal line Init, the first reset control signal line Rst1 and the second reset control signal line Rst2 are the same reset control signal line Rst, and the first light emission control signal line EM1 and the second light emission control signal line EM2 are the same light emission control signal line EM, which, however, is not limited.

Similar to the pixel circuit 2, the first light emission control signal and the second light emission control signal in the dummy pixel circuit 3 may be the same, that is, the control electrode of the first light emission control transistor T5 and the control electrode of the second light emission control transistor T6 may be electrically connected to the same signal line, for example, the first light emission control signal line EM1, to receive the same signal (e.g., the first light emission control signal). In this case, the display substrate may not be provided with the second light emission control signal line EM2, so as to reduce the number of signal lines. For another example, the control electrode of the first light emission control transistor T5 and the control electrode of the second light emission control transistor T6 may be electrically connected to different signal lines, that is, the control electrode of the first light emission control transistor T5 is electrically connected to the first light emission control signal line EM1, the control electrode of the second light emission control transistor T6 is electrically connected to the second light emission control signal line EM2, and the first light emission control signal line EM1 and the second light emission control signal line EM2 transmit the same signal.

It should be noted that when the first light emission control transistor T5 and the second light emission control transistor T6 are transistors of different types, for example, the first light emission control transistor T5 is a P-type transistor, and the second light emission control transistor T6 is an N-type transistor, the first light emission control signal and the second light emission control signal may be different, which is not limited in the embodiments of the present disclosure.

Figure 4C:
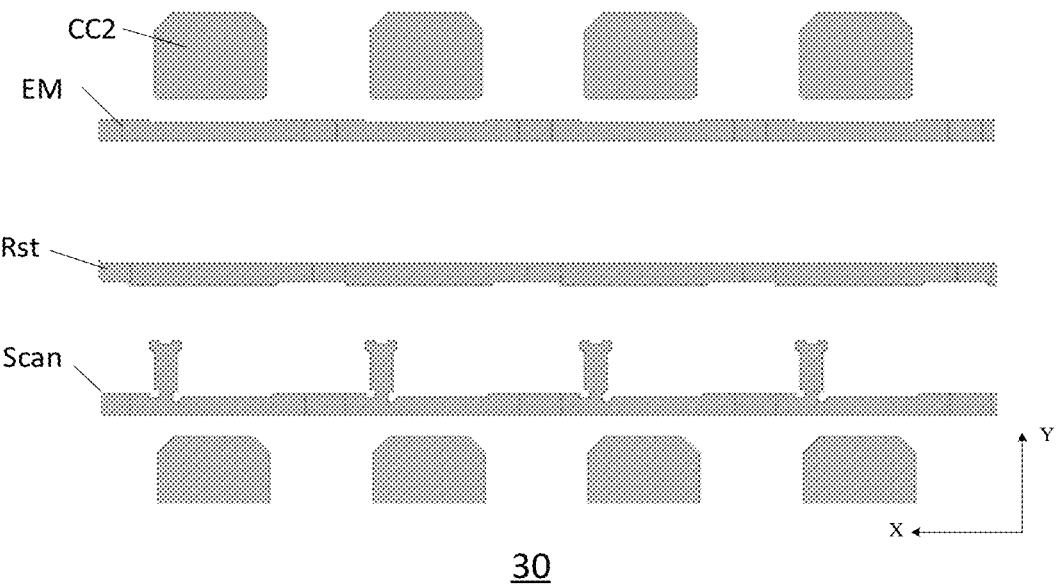
FIG. 4C is a plan structural view of a first conductive layer of a dummy pixel circuit in a display substrate provided by an embodiment of the present disclosure.
Figure 4D:
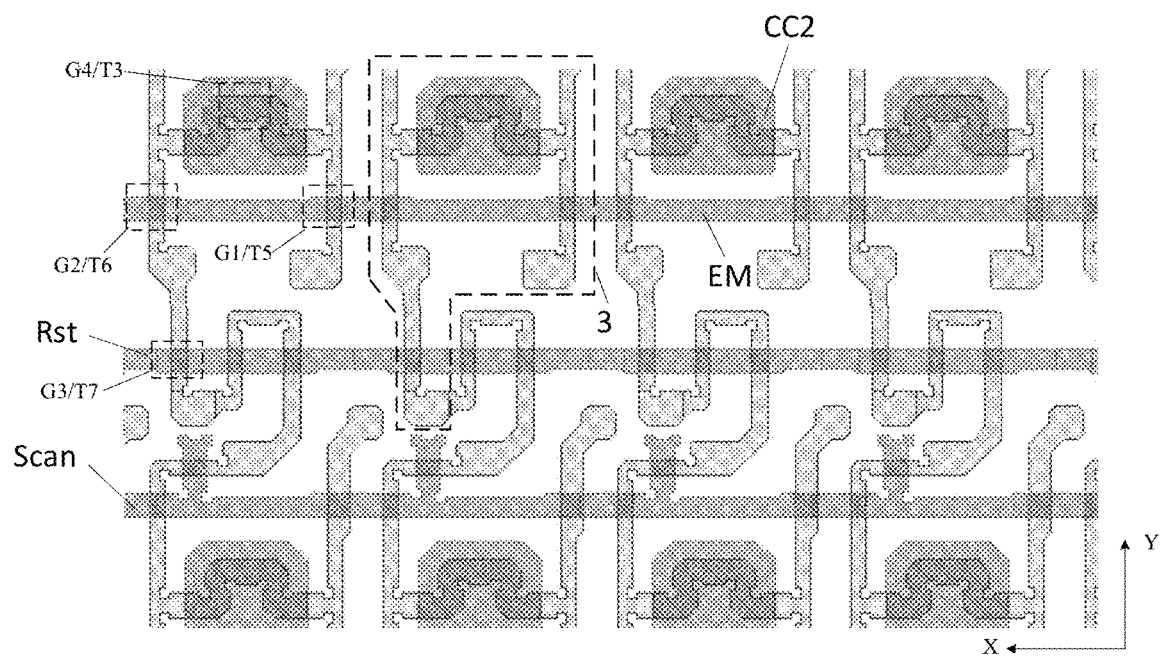
FIG. 4D is a schematic diagram of a stacked structure of an active semiconductor layer and a first conductive layer of a dummy pixel circuit in a display substrate provided by an embodiment of the present disclosure.

For example, as shown in FIG. 4C, FIG. 4 shows a schematic plan structural view of the first conductive layer 30. The first conductive layer 30 is disposed on the side of the active semiconductor layer 20 away from the substrate 1, and the gate insulating layer 21 is disposed between the first conductive layer 30 and the active semiconductor layer 20, so that the first conductive layer 30 and the active semiconductor layer 20 are insulated from each other. The first conductive layer 30 may include the second electrode CC2 of the storage capacitor Cst, the scan signal line Scan, the reset control signal line Rst, and the light emission control signal line EM, that is, the plurality of scan signal lines Scan, the plurality of reset control signal lines Rst, and the plurality of light emission control signal lines EM are arranged in the same layer. In the peripheral area S2, the first conductive layer 30 further includes control electrodes (i.e., gates) of the first light emission control transistor T5, the second light emission control transistor T6, and the first reset transistor T7. For example, as shown in FIG. 4D, FIG. 4D is a schematic diagram of a stacked structure obtained by stacking the active semiconductor layer 20 shown in FIG. 4B and the first conductive layer 30 shown in FIG. 4C and omitting the gate insulating layer 21. The control electrode G1 of the first light emission control transistor T5 may be an overlapping portion of the light emission control signal line EM and the active semiconductor layer 20, the control electrode G2 of the second light emission control transistor T6 may be an overlapping portion of the light emission control signal line EM and the active semiconductor layer 20, the control electrode G3 of the first reset transistor T7 may be an overlapping portion of the reset control signal line Rst and the active semiconductor layer 20, and the control electrode G4 of the driving transistor T3 may be the second electrode CC2 of the storage capacitor Cst.

It should be noted that each dashed rectangular box in FIG. 4B shows one overlapping portion of the first conductive layer 30 and the active semiconductor layer 20. As the channel region of each transistor, portions of the active semiconductor layer on both sides of each channel region become conductive through processes such as ion doping to form the first electrode and the second electrode of each transistor.

For example, as shown in FIG. 4C, the scan signal line Scan, the reset control signal line Rst, and the light emission control signal line EM are arranged along the second direction (Y direction). The reset control signal line Rst is located between the scan signal line Scan and the light emission control signal line EM.

For example, as shown in FIG. 4C, in the second direction (Y direction), the second electrode CC2 (i.e., lower electrode plate) of the storage capacitor Cst is located between the scan signal line Scan and the light emission control signal line EM.

Figure 4E:
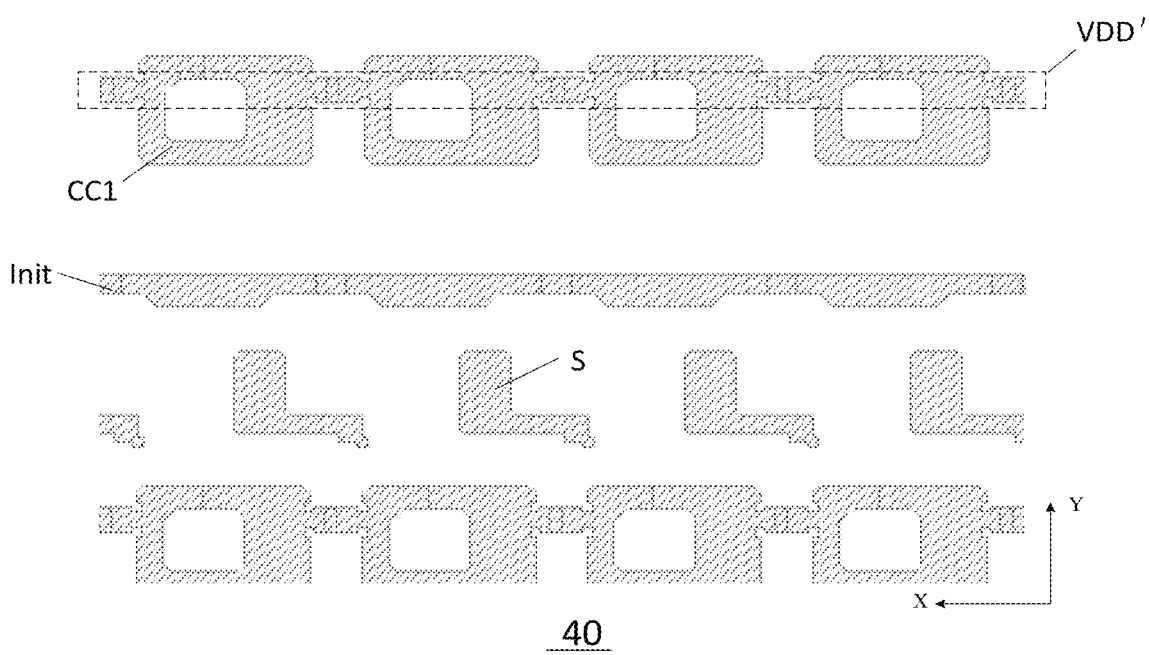
FIG. 4E is a plan structural view of a second conductive layer of a dummy pixel circuit in a display substrate provided by an embodiment of the present disclosure.

For example, as shown in FIG. 4E, FIG. 4E shows a schematic plan structural view of a second conductive layer 40. The second conductive layer 40 is disposed on the side of the first conductive layer 30 away from the substrate 1, and the first insulating layer 31 is disposed between the first conductive layer 30 and the second conductive layer 40. The first insulating layer 31 insulates the first conductive layer 30 from the second conductive layer 40. Referring to FIG. 4E, the second conductive layer 40 includes the first electrode CC1 of the storage capacitor Cst, the reset power signal line Init, the sub power supply signal line VDD', and a light shielding portion S. The second electrode CC2 located in the first conductive layer 30 and the first electrode CC1 located in the second conductive layer 40 at least partially overlap in a direction perpendicular to the substrate 1 to form the storage capacitor Cst. The sub power supply signal line VDD' (shown by the dashed box in FIG. 4E) and the first electrode CC1 of the storage capacitor Cst may be formed as a single piece, so that the sub power supply signal line VDD' extends in the first direction and a plurality of power supply signal lines VDD extending in the second direction (Y direction) are connected through the sub power supply signal line VDD' and the first electrodes CC1 of the capacitors C to form grid-like wiring to reduce resistance.

For example, as shown in FIG. 2C, in the pixel circuit 2 in the display area S2, the threshold compensation transistor T2 is in a floating state when it is turned off, and is susceptible to jump due to an influence of a voltage of a surrounding line, thereby affecting a leakage current of the threshold compensation transistor T2, which in turn affects luminous brightness. In order to keep the voltage of the active semiconductor layer between the two channels of the threshold compensation transistor T2 stable, the light shielding portion S and the active semiconductor layer between the two channels of the threshold compensation transistor T2 are designed to form a capacitor, and the light shielding portion S may be connected to the power supply signal line VDD to be applied with a constant voltage, and therefore the voltage of the active semiconductor layer in a floating state can be kept stable. The light shielding portion S and the active semiconductor layer between the two channels of the threshold compensation transistor T2 overlap, which can also prevent the active semiconductor layer between the two channels from being irradiated to cause changed characteristics, for example, to prevent the voltage of this part of the active semiconductor layer from changing, so as to prevent crosstalk. In the dummy pixel circuit 3 in the peripheral area S2, the dummy pixel circuit 3 does not include the threshold compensation transistor T2, but in the process of fabricating the second conductive layer 40, in order to ensure the uniformity of etching, the dummy pixel circuit 3 is also provided therein with the light shielding portion S. The light shielding portion S is located on at least one side between the first electrode CC1 of the storage capacitor Cst and the reset power signal line Init.

Figure 4F:
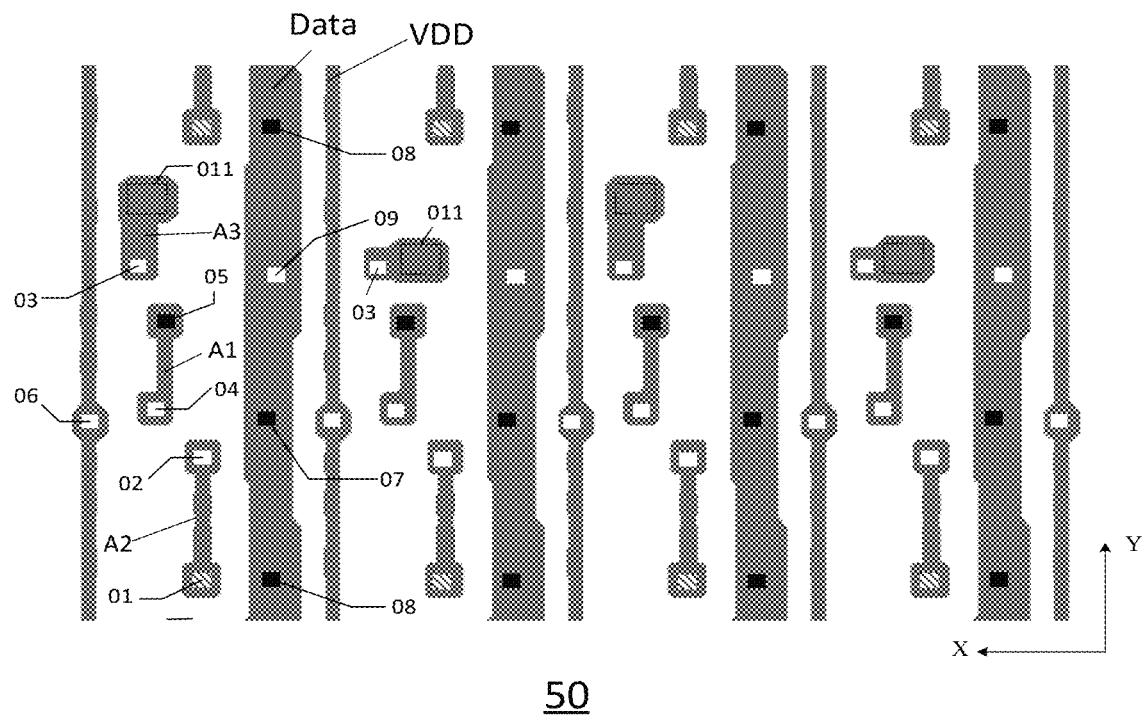
FIG. 4F is a plan structural view of a source-drain metal layer of a dummy pixel circuit in a display substrate provided by an embodiment of the present disclosure.
Figure 4G:
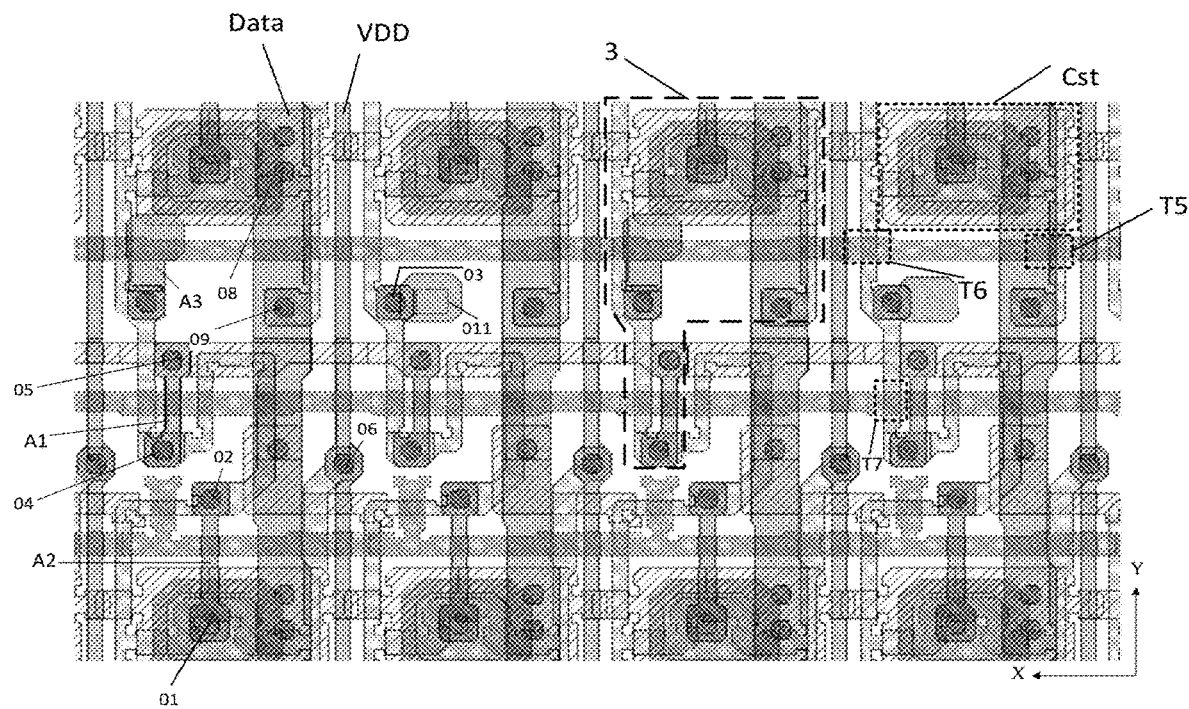
FIG. 4G is a schematic diagram of a stacked structure of an active semiconductor layer, a first conductive layer, a second conductive layer, and a source-drain metal layer of a dummy pixel circuit in a display substrate provided by an embodiment of the present disclosure.

For example, as shown in FIG. 4F, FIG. 4F shows a schematic plan structural view of a source/drain metal layer 50. The source/drain metal layer 50 is disposed on the side of the second conductive layer 40 away from the substrate 1, and the second insulating layer 41 is disposed between the second conductive layer 40 and the source/drain metal layer 50. The second insulating layer 41 insulates the source/drain metal layer 50 from the second conductive layer 40. The source/drain metal layer 50 includes the data line Data and the power supply signal line VDD. Both the data line Data and the power supply signal line VDD extend in the second direction (Y direction). That is, a plurality of data lines Data are arranged on the side of the reset power signal line Init away from the scan signal line Scan, a plurality of power supply signal lines VDD and the plurality of data lines Data are arranged in the same layer, and in the first direction (X direction), the power supply signal lines VDD and the data lines Data are alternately arranged.

For example, as shown in FIG. 4F, the source/drain metal layer 50 further includes a first connection portion A1, a second connection portion A2, and a third connection portion A3. The first connection portion A1, the second connection portion A2, and the third connection portion A3 are repeatedly arranged in the second direction (Y direction) in the source/drain metal layer 50, the second connection portion A2 is configured to be electrically connected to the control electrode of the driving transistor T3 (i.e., the second electrode CC2 of the storage capacitor Cst), the first connection portion A1 is configured to be connected to the reset power signal line Init and the first electrode of the first reset transistor T7, and the third connection portion A3 is configured to be connected to the first electrode and the second electrode of the second light emission control transistor T6.

FIG. 4F also shows exemplary positions of a plurality of via holes in the source/drain metal layer 50. The source/drain metal layer 50 is connected to a plurality of film layers between the source/drain metal layer 50 and the substrate 1 through the plurality of via holes. As shown in FIG. 4F, the via holes with different fillers indicate that the source/drain metal layers 50 is connected to different film layers therethrough. For example, via holes filled with white color indicate that the source/drain metal layer 50 is connected to the active semiconductor layer 20 shown in FIG. 4B through these via holes, via holes filled with diagonals indicate that the source/drain metal layer 50 is connected to the first conductive layer 30 shown in FIG. 4C through these via holes, and via holes filled with black color indicate that the source/drain metal layer 50 is connected to the second conductive layer 40 shown in FIG. 4E through these via holes.

For example, as shown in FIGS. 4A to 4C and FIGS. 4E to 4G, FIG. 4G is a schematic diagram of a stacked structure formed by stacking the active semiconductor layer 20 shown in FIG. 4B, the first conductive layer 30 shown in FIG. 4C, the second conductive layer 40 shown in FIG. 4E, and the source/drain metal layer 50 shown in FIG. 4F on top of each other (with each insulating layer being omitted). In film layers of the pixel circuit 2 in the display area S1, the data line Data is electrically connected to the second electrode of the data writing transistor T4 through the via hole 06 penetrating through the gate insulating layer 21, the first insulating layer 31 and the second insulating layer 41. In the dummy pixel circuit 3 in the peripheral area S2, although the dummy pixel circuit 3 does not have the data writing transistor T4, in a via hole forming process, in order to improve the uniformity of the via hole forming process in the pixel circuit 2, a via hole 06 is also formed in the source/drain metal layer 50 of the dummy pixel circuit 3. That is, the number and positions of via holes in the film layers of the dummy pixel circuit 3 are the same as the number and positions of via holes in the pixel circuit 2, but only part of the via holes are used in the dummy pixel circuit 3. Via holes for electrically connecting the threshold compensation transistor T2, the second reset transistor T1, and the data writing transistor T4 mentioned in the following description are only used in the pixel circuit 2 in the display area S1, and exist in the dummy pixel circuit 3 but are not for electric connection. The power supply signal line VDD is electrically connected to the first electrode of the first light emission control transistor T5 through a hole via 09 penetrating through the gate insulating layer 21, the first insulating layer 31, and the second insulating layer 41. The power supply signal lines VDD and the data lines Data are alternately arranged along the first direction. The power supply signal line VDD is electrically connected to the sub power supply signal line VDD' (the first electrode CC1 of the storage capacitor Cst) through a via hole 08 penetrating through the second insulating layer 41. The power supply signal line VDD extends in the second direction (Y direction). The sub power supply signal line VDD' extends in the first direction (X direction), so that the power supply signal lines VDD and the sub power supply signal lines VDD' form grid-like wring on the substrate 1 of the display substrate. That is to say, on the substrate 1 of the whole display substrate, the power supply signal lines VDD and the sub power supply signal lines VDD' are arranged in a grid-like manner, so that the signal lines of the first power supply terminal ELVDD have a small resistance and a low voltage drop, which can in turn improve the stability and uniformity of the power supply voltage provided by the first power supply terminal ELVDD. The power supply signal line VDD is electrically connected to the light shielding portion S through a via hole 07 penetrating through the second insulating layer 41, so that the power supply signal line VDD can provide the light shielding portion S with a constant voltage. One end of the first connection portion A1 is electrically connected to the reset power signal line Init through a via hole 05 penetrating through the second insulating layer 41, and the other end of the first connection portion A1 is electrically connected to the first electrode of the first reset transistor T7 through a via hole 04 penetrating through the gate insulating layer 21, the first insulating layer 31 and the second insulating layer 41. One end of the second connection portion A2 is electrically connected to the second electrode of the threshold compensation transistor T2 through a via hole 02 penetrating through the gate insulating layer 21, the first insulating layer 31 and the second insulating layer 41, and the other end of the second connection portion A2 is electrically connected to the gate electrode of the driving transistor T3 through a via hole 01 penetrating through the first insulating layer 31 and the second insulating layer 41. One end of the third connection portion A3 is electrically connected to the second electrode of the second light emission control transistor T6 through a via hole 03 penetrating through the gate insulating layer 21, the first insulating layer 31 and the second insulating layer 41.

In some exemplary embodiments, as shown in FIG. 4A, a planarization layer 51 (for protecting the source/drain metal layer 50) is formed on the source/drain metal layer 50. As shown in FIG. 4F, the planarization layer 50 includes a via hole 011, the first electrode 601 of the light-emitting device 6 of the sub-pixel in the pixel unit may be disposed on the side of the planarization layer 50 away from the substrate 1, and the first electrode 601 of the light-emitting device 6 is electrically connected to the other end of the third connection portion A3 through the via hole 011 to connect the second light emission control transistor T6 with the first electrode 601. An orthographic projection (as indicated by the dashed box in FIG. 4F) of the via hole 011 in the planarization layer 51 on the source/drain metal layer 50 is located within the third connection portion A3.

Figure 4H:
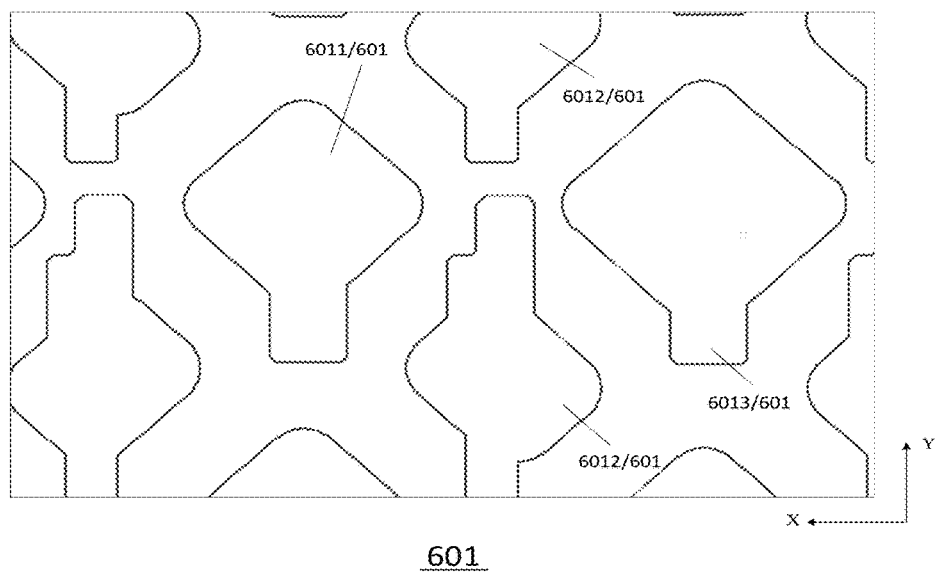
FIG. 4H is a plan structural view of a first electrode of a dummy pixel circuit in a display substrate provided by an embodiment of the present disclosure.
Figure 4I:
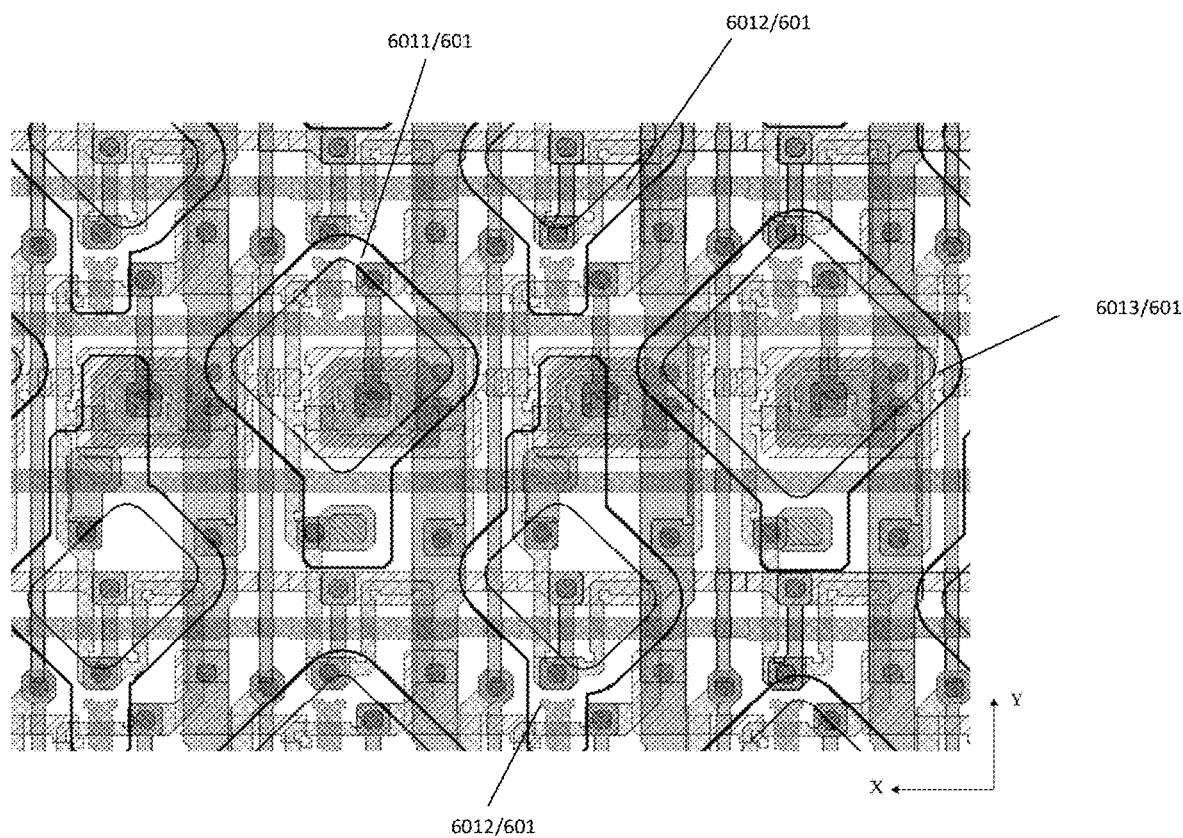
FIG. 4I is a schematic diagram of a stacked structure of an active semiconductor layer, a first conductive layer, a second conductive layer, a source-drain metal layer, and a first electrode of a dummy pixel circuit in a display substrate provided by an embodiment of the present disclosure.

In some exemplary embodiments, as shown in FIGS. 4A and 4H to 4I, FIG. 4I is a schematic diagram of a stacked structure formed by stacking the active semiconductor layer 20 shown in FIG. 4B, the first conductive layer 30 shown in FIG. 4C, the second conductive layer 40 shown in FIG. 4E, the source/drain metal layer 50 shown in FIG. 4F and the first electrode 406 shown in FIG. 4H. The first electrode 601 of the light-emitting device 6 is further disposed on the side of the source/drain metal layer 50 away from the substrate 1. Each pixel unit may include a plurality of sub-pixels. In the display area S1, each sub-pixel corresponds to a light-emitting device. In the peripheral area S2, each sub-pixel corresponds to one first electrode. For example, as shown in FIG. 4H, each pixel unit includes a sub-pixel of a first color, a sub-pixel group of a second color, and a sub-pixel of a third color that are arranged along a first direction (X direction). Each sub-pixel group of the second color includes two sub-pixels of the second color and arranged along a second direction (Y direction). The light-emitting device of the sub-pixel of the first color corresponds to a first electrode 6011 of the first color, the light-emitting device of the sub-pixel of the second color corresponds to a first electrode 6012 of the second color, and the light-emitting device of the sub-pixel of the third color corresponds to a first electrode 6013 of the third color. Referring to FIG. 4I, an orthographic projection of each first electrode 6011 of the first color on the substrate 1 is within an orthographic projection of the data line Data on the substrate 1. There is no source/drain metal layer 50 directly below a center line extending in the second direction of the first electrode 6012 of the second color. An orthographic projection of the first electrode 6012 of the second color on the substrate 1 overlaps orthographic projections of the data line Data and the first connection portion A1 on the substrate 1. For example, as shown in FIG. 4I, the first electrode 6011 of the first color overlaps the power supply signal line VDD, the data line Data, and the third connection portion A3, and the power supply signal line VDD and the third connection portion A3 are located on both sides of the data line Data, respectively. In a direction perpendicular to the substrate 1, the first electrode 6012 of the second color overlaps the data line Data, the power supply signal line VDD, the first connection portion A1, and the third connection portion A3, and the center line of the first electrode 6012 of the second color overlaps the third connection portion A3. In the direction perpendicular to the substrate 1, the first electrode 6013 of the third color overlaps the data line Data, the power supply signal line VDD, the second connection portion A2, the first connection portion A1, and the third connection portion A3, the data line Data is located on one side of a center line, and the second connection portion A2 is located on the other side of the center line.

For example, as shown in FIG. 5, in a case where the dummy pixel circuit 3 is further provided with a pixel defining layer 70 on the first electrode 601, based on the film layers shown in FIG. 4I, the pixel defining layer 70 may be fabricated on the side of the first electrode 601 away from the substrate 1.

Figure 7:
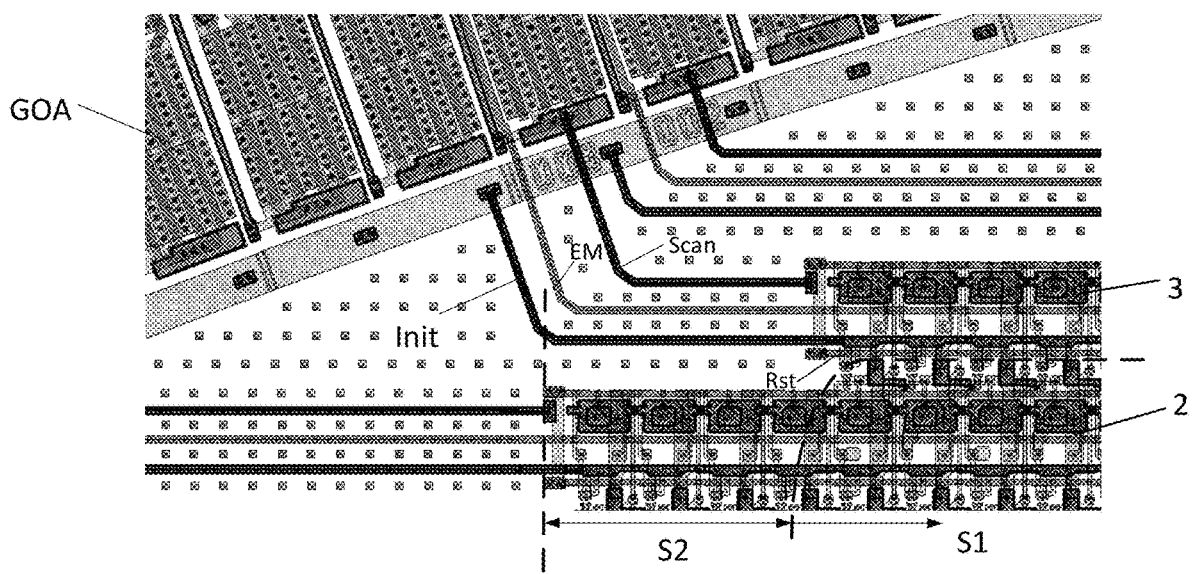
FIG. 7 is a schematic diagram illustrating positions of GOA, dummy pixel circuits, and pixel circuits in a display substrate provided by an embodiment of the present disclosure.

In some embodiments, as shown in FIG. 7, the display substrate further includes a Gate Drive on Array (GOA), the GOA is arranged on at least one side of the peripheral area S2 away from the display area S1, and a plurality of signal lines extend from an area where the GOA is provided to the peripheral area S2, and then extends from the peripheral area S2 to the display area S1 to connect the pixel circuit 2 and the dummy pixel circuit 3. Specifically, the signal lines may include a reset power signal line Init, a light emission control signal line EM, a scan signal line Scan, a reset control signal line Rst, etc. The reset power signal line Init may be electrically connected to the first electrode of the second reset transistor T1 and the first electrode of the first reset transistor T7; the light emission control signal line EM may be electrically connected to the control electrode of the first light emission control transistor T5 and the control electrode of the second light emission control transistor T6; the scan signal line Scan may be electrically connected to the control electrode of the threshold compensation transistor T2 and the control electrode of the data writing transistor T4; the reset control signal line Rst may be electrically connected to the control electrode of the first reset transistor T7 and the control electrode of the second reset transistor T1. Of course, the specific structures of the plurality of signal lines are not limited to the structures described above, which are only exemplary structures, and do not limit the present disclosure. The plurality of signal lines pass through gaps between adjacent dummy pixel circuits 3 in the peripheral area S2, and are connected to the pixel circuits 2 in the display area S1. As the space occupied by the dummy pixel circuits 3 is reduced, the density of the dummy pixel circuits 3 is reduced in the peripheral area S2, and therefore the plurality of signal lines may be led to the pixel circuits 2 through the gaps between the plurality of dummy pixel circuits 3, and a short circuit between the plurality of signal lines caused by too dense dummy pixel circuits 3 can be avoided.

In a second aspect, embodiments of the present disclosure further provide a display device, including the above display substrate. It should be noted that the display device provided in the embodiments may be any product or component with a display function, such as a mobile phone, a tablet computer, a television, a monitor, a notebook computer, a digital photo frame, a navigator, or the like. Other essential components of the display device are known by those of ordinary skill in the art, will not be repeated herein, and should not be used as a limitation to the present disclosure.

Further, the display device may include various types of display devices, such as a liquid crystal display device, an organic light emitting diode (OLED) display device, and a mini diode (Mini LED) display device, which is not limited herein.

It can be understood that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements are also deemed to be within the protection scope of the present disclosure.

What is claimed is:

1. A display substrate having a display area and a peripheral area surrounding the display area, and the display substrate comprising:
   a substrate;
   a plurality of pixel circuits on the substrate and in the display area; and
   a plurality of dummy pixel circuits on the substrate and in the peripheral area; wherein
   a number of transistors in each dummy pixel circuit is smaller than a number of transistors in each pixel circuit.

2. The display substrate of claim 1, wherein the dummy pixel circuit comprises a driving transistor, a first light emission control transistor, a second light emission control transistor, a first reset transistor, and a storage capacitor; wherein
   the driving transistor is on a side of the storage capacitor close to the substrate;
   the first light emission control transistor and the second light emission control transistor are on a first side of the storage capacitor; and
   the first reset transistor is on a side, away from the storage capacitor, of a connection line between the first light emission control transistor and the second light emission control transistor.

3. The display substrate of claim 2, further comprising:
   a plurality of scan signal lines extending from the display area to the peripheral area along a first direction and being on the substrate;
   a plurality of reset power signal lines extending from the display area to the peripheral area along the first direction and being on a side of a layer where the plurality of scan signal lines are located away from the substrate;
   a plurality of reset control signal lines extending from the display area to the peripheral area along the first direction and being in the same layer as the plurality of scan signal lines; and
   a plurality of light emission control signal lines extending from the display area to the peripheral area along the first direction and in the same layer as the plurality of scan signal lines; wherein
   a first electrode of the first reset transistor is electrically connected to the reset power signal line;
   a control electrode of the first reset transistor is electrically connected to the reset control signal line; and
   a control electrode of the first light emission control transistor is electrically connected to the light emission control signal line.

4. The display substrate of claim 3, further comprising:
   a plurality of data lines extending from the display area to the peripheral area along a second direction and being on a side of the plurality of reset power signal lines away from the plurality of scan signal lines;
   a plurality of power supply signal lines extending from the display area to the peripheral area along the second direction, the plurality of power supply signal lines and the plurality of data lines being arranged alternately in a same layer; the first direction intersecting the second direction; wherein
   a first electrode of the storage capacitor is electrically connected to the power supply signal line, and a second electrode of the storage capacitor is electrically connected to a control electrode of the driving transistor; and
   a first electrode of the first light emission control transistor is electrically connected to the power supply signal line.

5. The display substrate of claim 4, further comprising a first electrode on a side of the plurality of data lines away from the substrate; wherein
   a second electrode of the first reset transistor is electrically connected to the first electrode; and
   a second electrode of the second light emission control transistor is electrically connected to the first electrode.

6. The display substrate of claim 5, wherein each of the plurality of dummy pixel circuits further comprises a first connection portion, a second connection portion, and a third connection portion in the same layer as the data line; the first connection portion, the second connection portion, and the third connection portion are arranged along the second direction;
   the first connection portion is configured to be connected to the reset power signal line and the first electrode of the first reset transistor, the second connection portion is configured to be connected to the control electrode of the driving transistor, and the third connection portion is configured to be connected to the second electrode of the second light emission control transistor and the first electrode.

7. The display substrate of claim 6, further comprising: an active semiconductor layer on the substrate; wherein the active semiconductor layer comprises active layers of all transistors in the plurality of pixel circuits and the plurality of dummy pixel circuits.

8. The display substrate of claim 7, wherein active layers of all transistors in each dummy pixel circuit are formed as a single piece.

9. The display substrate of claim 7, further comprising:
   a first conductive layer on a side of the active semiconductor layer away from the substrate; and
   a gate insulating layer between the active semiconductor layer and the first conductive layer; wherein
   the first conductive layer comprises second electrodes of the plurality of storage capacitors, the plurality of scan signal lines extending in the first direction, the plurality of reset control signal lines extending in the first direction, and the plurality of light emission control signal lines extending in the first direction; and
   in the peripheral area, the first conductive layer further comprises gates of the first light emission control transistor, the second light emission control transistor, and the first reset transistor in each dummy pixel circuit.

10. The display substrate of claim 9, further comprising:
    a second conductive layer on a side of the first conductive layer away from the gate insulating layer; and
    a first insulating layer between the second conductive layer and the first conductive layer; wherein the second conductive layer comprises the plurality of reset power signal lines extending along the first direction, and first electrodes of the plurality of storage capacitors.

11. The display substrate of claim 10, further comprising:
a source/drain metal layer on a side of the second conductive layer away from the first insulating layer; and
a second insulating layer between the source/drain metal layer and the second conductive layer; wherein
the source/drain metal layer comprises the plurality of power supply signal lines extending in the second direction, the plurality of data lines extending in the second direction, the plurality of first connection portions, the plurality of second connection portions, and the plurality of third connection portions.

12. The display substrate of claim 1, further comprising: a gate drive on array on at least one side of the peripheral area away from the display area, and the gate drive on array is connected to the pixel circuit in the display area through a first lead passing through the peripheral area.

13. The display substrate of claim 1, wherein each pixel circuit comprises a first light emission control transistor, a second light emission control transistor, a driving transistor, a data writing transistor, a storage capacitor, a threshold compensation transistor, a first reset transistor, and a second reset transistor;
a first electrode of the data writing transistor is electrically connected to a first electrode of the driving transistor, a second electrode of the data writing transistor is electrically connected to the data line to receive a data signal, and a control electrode of the data writing transistor is electrically connected to the scan signal line to receive a scan signal;
a first electrode of the storage capacitor is electrically connected to the power supply signal line, and a second electrode of the storage capacitor is electrically connected to a control electrode of the driving transistor;
a first electrode of the threshold compensation transistor is electrically connected to a second electrode of the driving transistor, a second electrode of the threshold compensation transistor is electrically connected to the control electrode of the driving transistor, and a control electrode of the threshold compensation transistor is electrically connected to the scan signal line to receive a compensation control signal;
a first electrode of the first reset transistor is electrically connected to the reset power signal line to receive a first reset signal, a second electrode of the first reset transistor is electrically connected to a light-emitting device, and a control electrode of the first reset transistor is electrically connected to the reset control signal line to receive a first reset control signal;
a first electrode of the second reset transistor is electrically connected to the reset power signal line to receive a second reset signal, a second electrode of the second reset transistor is electrically connected to the control electrode of the driving transistor, and a control electrode of the second reset transistor is electrically connected to the reset control signal line to receive a second reset control signal;
a first electrode of the first light emission control transistor is electrically connected to the power supply signal line, a second electrode of the first light emission control transistor is electrically connected to the first electrode of the driving transistor, and a control electrode of the first light emission control transistor is electrically connected to the light emission control signal line to receive a first light emission control signal; and
a first electrode of the second light emission control transistor is electrically connected to the second electrode of the driving transistor, a second electrode of the second light emission control transistor is electrically connected to the light-emitting device, and a control electrode of the second light emission control transistor is electrically connected to the light emission control signal line to receive a second light emission control signal.

14. A display device, comprising the display substrate of claim 1.

* * * * *